United States Patent
Kim (10) Patent No.: US 9,793,082 B2
(45) Date of Patent: Oct. 17, 2017

(54) METHOD OF MANUFACTURING FLAT PANEL DISPLAY FOR HEATING SEALING UNIT WITH DIFFERENT LASER BEAMS

(71) Applicant: Samsung Display Co., Ltd., Yongin, Gyeonggi-Do (KR)

(72) Inventor: Taekon Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 164 days.

(21) Appl. No.: 14/598,024

(22) Filed: Jan. 15, 2015

(65) Prior Publication Data

US 2016/0020056 A1   Jan. 21, 2016

(30) Foreign Application Priority Data

Jul. 21, 2014 (KR) .................. 10-2014-0092083

(51) Int. Cl.
| | |
|---|---|
| *H01J 9/26* | (2006.01) |
| *H01L 51/52* | (2006.01) |
| *G02F 1/1333* | (2006.01) |
| *G02F 1/1339* | (2006.01) |

(52) U.S. Cl.
CPC .......... *H01J 9/261* (2013.01); *H01L 51/5246* (2013.01); *G02F 1/1339* (2013.01); *G02F 1/133351* (2013.01); *H01L 2251/566* (2013.01)

(58) Field of Classification Search
CPC ... H01L 51/524; H01L 51/0024; C03C 27/06; C03C 17/04; G02F 1/1333; B32B 17/06; Y10T 29/49171
See application file for complete search history.

(56) References Cited

U.S. PATENT DOCUMENTS

| | | | |
|---|---|---|---|
| 8,016,009 B2* | 9/2011 | Amsden ............... | C03C 23/001 156/105 |
| 2007/0195634 A1* | 8/2007 | Lee .................... | B23K 26/0604 365/230.05 |
| 2009/0058292 A1* | 3/2009 | Koo ......................... | C03C 8/24 313/512 |

(Continued)

FOREIGN PATENT DOCUMENTS

| | | |
|---|---|---|
| KR | 10-2009-0030704 A | 3/2009 |
| KR | 10-2011-0011422 A | 2/2011 |

(Continued)

*Primary Examiner* — Tracie Y Green
(74) *Attorney, Agent, or Firm* — Knobbe Martens Olson & Bear LLP (57) ABSTRACT

A method of manufacturing a flat panel display is disclosed. In one aspect, the method includes forming a plurality of display elements over a first substrate and forming over the first substrate or a second substrate a plurality of sealing units respectively surrounding the display elements. The method further c includes arranging the first and second substrates to face each other and emitting a laser beam to the sealing units so as to bond the first and second substrates. The emitting includes (a) emitting a first laser beam, from a first laser source, clockwise or counterclockwise along perimeters of the sealing units and (b) substantially simultaneously emitting a second laser beam, from a second laser source, to facing sides of adjacent ones of the sealing units.

20 Claims, 12 Drawing Sheets

(56) References Cited

U.S. PATENT DOCUMENTS

| | | | | |
|---|---|---|---|---|
| 2011/0165814 A1* | 7/2011 | Jung-Min | ............ | H01L 51/5246 |
| | | | | 445/25 |
| 2012/0138979 A1* | 6/2012 | Lee | ..................... | H01L 51/5246 |
| | | | | 257/91 |
| 2012/0248950 A1* | 10/2012 | Niibori | ............... | H01L 51/5246 |
| | | | | 312/223.1 |
| 2012/0294003 A1* | 11/2012 | Liu | ....................... | H01L 51/525 |
| | | | | 362/249.01 |
| 2014/0174664 A1* | 6/2014 | Lee | ......................... | C03C 27/00 |
| | | | | 156/380.9 |
| 2014/0177077 A1* | 6/2014 | Lee | .................... | G02B 27/0988 |
| | | | | 359/733 |

FOREIGN PATENT DOCUMENTS

| | | |
|---|---|---|
| KR | 10-2012-0018978 A | 3/2012 |
| KR | 10-2012-0049707 A | 5/2012 |
| KR | 10-2012-0076708 A | 7/2012 |

\* cited by examiner

METHOD OF MANUFACTURING FLAT PANEL DISPLAY FOR HEATING SEALING UNIT WITH DIFFERENT LASER BEAMS

CROSS-REFERENCE TO RELATED APPLICATIONS

This application claims the benefit of Korean Patent Application No. 10-2014-0092083, filed on Jul. 21, 2014, in the Korean Intellectual Property Office, the disclosure of which is incorporated herein in its entirety by reference.

BACKGROUND

Field

The described technology generally relates to a method of manufacturing a flat panel display.

Description of the Related Technology

A flat panel display, such as a liquid crystal display (LCD), an organic light-emitting diode (OLED) display, a plasma display panel (PDP), or an electrophoretic display (EPD), is manufactured by using a plurality of processes.

Examples of such processes include bonding a first substrate and a second substrate by melting and curing a sealant that is formed between the first and second substrates and cutting the bonded substrates into a plurality of the flat panel displays.

A plurality of display elements are formed on the first substrate, and a plurality of sealing units that respectively surround the display elements are formed between the first and second substrates.

SUMMARY OF CERTAIN INVENTIVE ASPECTS

One inventive aspect is a method of manufacturing a flat panel display which may relieve an asymmetric stress that is applied to the display substrates.

Another aspect is a method of manufacturing a flat panel display, which includes: forming a plurality of display elements on a first substrate; forming on the first substrate or a second substrate a plurality of sealing units that respectively surround the plurality of display elements; arranging the first substrate and the second substrate so that the first substrate and the second substrate face each other; and emitting a laser beam to the plurality of sealing units so that the first substrate and the second substrate are bonded to each other, wherein the emitting of the laser beam includes: (a) emitting a laser beam clockwise or counterclockwise along shapes of the plurality of sealing units by using a first laser source; and (b) simultaneously emitting a laser beam to facing sides of adjacent sealing units of the plurality of sealing units by using a second laser source.

In the emitting operation (a), points in time at which the laser beam is emitted to the facing sides of the adjacent sealing units by using the first laser source may be different from each other.

In the emitting operation (a), heights of the facing sides of the adjacent sealing units may be different from each other.

In the simultaneously emitting operation (b), the heights of the facing sides of the adjacent sealing units may be the same due to the second laser source.

In the simultaneously emitting operation (b), each of the plurality of sealing units may include a first portion to which the laser beam of the second laser source is emitted and a second portion to which the laser beam of the second laser source is not emitted, wherein colors of the first portion and the second portion are different from each other.

In the simultaneously emitting operation (b), the laser beam may be emitted to the facing sides of the adjacent sealing units by using the second laser source that is a single laser source.

The method may further include cutting the first substrate and the second substrate along a cutting line according to unit display elements.

Another aspect is a method of manufacturing a flat panel display, including bonding a first substrate on which a plurality of display elements are formed and a second substrate that is formed to face the first substrate by using a plurality of sealing units that are formed to respectively surround the plurality display elements, the method including: (a) emitting a laser beam clockwise or counterclockwise along shapes of the plurality of sealing units by using a first laser source; and (b) simultaneously emitting a laser beam to facing sides of adjacent sealing units of the plurality of sealing units by using a second laser source.

In the emitting operation (a), points in time at which the laser beam is emitted to the facing sides of the adjacent sealing units by using the first laser source may be different from each other.

In the emitting operation (a), heights of the facing sides of the adjacent sealing units may be different from each other.

In the simultaneously emitting operation (b), the heights of the facing sides of the adjacent sealing units may be the same due to the second laser source.

In the simultaneously emitting operation (b), each of the plurality of sealing units may include a first portion to which the laser beam of the second laser source is emitted and a second portion to which the laser beam of the second laser source is not emitted, wherein colors of the first portion and the second portion are different from each other.

In the simultaneously emitting operation (b), the laser beam may be simultaneously emitted to the facing sides of the adjacent sealing units by using the second laser source that is a single laser source. These general and specific embodiments may be implemented by using a system, a method, a computer program, or a combination of the system, the method, and the computer program.

Another aspect is a method of manufacturing a flat panel display, the method comprising: forming a plurality of display elements over a first substrate; forming over the first substrate or a second substrate a plurality of sealing units respectively surrounding the display elements; arranging the first and second substrates to face each other; and emitting a laser beam to the sealing units so as to bond the first and second substrates, wherein the emitting comprises: (a) emitting a first laser beam, from a first laser source, clockwise or counterclockwise along perimeters of the sealing units; and (b) substantially simultaneously emitting a second laser beam, from a second laser source, to facing sides of adjacent ones of the sealing units.

In the above method, during the emitting (a), the first laser beam is sequentially emitted along the perimeters of the sealing units including the facing sides of the adjacent sealing units. In the above method, the emitting (a) is performed such that the heights of the facing sides of the adjacent sealing units are different from each other. In the above method, the emitting (b) is performed such that the heights of the facing sides of the adjacent sealing units are substantially identical to each other. In the above method, each of the sealing units comprises a first portion to which the second laser beam is emitted and a second portion to which the second laser beam is not emitted, and wherein the first and second portions have different colors. In the above method, the second laser source comprises a single laser source. The above method further comprises cutting the first substrate and the second substrate along a cutting line according to unit display elements.

Another aspect is a manufacturing a flat panel display, the method comprising: providing a plurality of sealing units to respectively surround a plurality of display elements forme between first and second substrates facing each other; first emitting a first laser beam, from a first laser source, clockwise or counterclockwise along perimeters of the sealing units; and second emitting a second laser beam substantially simultaneously, from a second laser source, to facing sides of adjacent ones of the sealing units.

In the above method, the first laser beam is sequentially emitted along the perimeters of the sealing units including the facing sides of the adjacent sealing units. In the above method, the first emitting is performed such that the heights of the facing sides of the adjacent sealing units are different from each other. In the above method, the second emitting is performed such that the heights of the facing sides of the adjacent sealing units are substantially identical to each other. In the above method, each of the sealing units comprises a first portion to which the second laser beam is emitted and a second portion to which the second laser beam is not emitted, and wherein the first and second portions have different colors. In the above method, the second laser source comprises a single laser source.

Another aspect is a method of manufacturing a flat panel display, the method comprising: forming a plurality of display elements between first and second substrates; forming a plurality of sealing units between the first and second substrates to respectively surround the display elements; sequentially emitting a first laser beam, from a first laser source, along perimeters of the sealing units; and substantially simultaneously emitting a second laser beam, from a second laser source, to facing sides of adjacent ones of the sealing units.

In the above method, the perimeters comprise the facing sides of the adjacent sealing units, and wherein the sequentially emitting is performed such that the heights of the facing sides of the adjacent sealing units are different from each other. In the above method, the substantially simultaneously emitting is performed such that the heights of the facing sides of the adjacent sealing units are substantially identical to each other. In the above method, each of the sealing units comprises a first portion to which the second laser beam is emitted and a second portion to which the second laser beam is not emitted, and wherein the first and second portions have different colors. In the above method, the second laser source comprises a single laser source. In the above method, the sealing units are arranged in a column and row configuration. In the above method, the sealing units are spaced apart from each other.

DETAILED DESCRIPTION OF CERTAIN INVENTIVE EMBODIMENTS

In order to melt and cure the sealing units, a laser beam is emitted to the sealing units. For example, the laser beam is emitted along shapes of the sealing units. When the laser beam is emitted along the shapes of the sealing units, a temperature difference occurs between a left side and a right side of each of the sealing units and between upper and lower sides of each of the sealing units, thereby leading to a temperature difference between facing sides of adjacent sealing units.

Due to the temperature difference, an asymmetric stress is applied to the first and second substrates that are supported by the sealing units. When the first and second substrates are cut into the flat panel displays, the first or second substrate to which the asymmetric stress is applied may not be cut into a desired shape and may be damaged. Accordingly, a cutting margin having a predetermined width or more is required, which is against the trend to minimize a dead space of each of the flat panel displays.

As used herein, the term "and/or" includes any and all combinations of one or more of the associated listed items. Expressions such as "at least one of," when preceding a list of elements, modify the entire list of elements and do not modify the individual elements of the list.

Embodiments will now be described more fully with reference to the accompanying drawings. The same or corresponding elements in the drawings are denoted by the same reference numerals, and a repeated explanation thereof will not be given.

It will be understood that although the terms "first", "second", etc. may be used herein to describe various elements, these elements should not be limited by these terms. These elements are only used to distinguish one element from another.

As used herein, the singular forms "a," "an" and "the" are intended to include the plural forms as well, unless the context clearly indicates otherwise.

It will be understood that when a layer, region, or element is referred to as being "formed on," another layer, region, or element, it can be directly or indirectly formed on the other layer, region, or element. That is, for example, intervening layers, regions, or elements may be present.

Sizes of elements may be exaggerated for convenience of explanation. In other words, since sizes and thicknesses of elements in the drawings are arbitrarily illustrated for convenience of explanation, the following embodiments are not limited thereto.

When certain embodiments may be implemented differently, a specific process order may be performed differently from the described order. For example, two consecutively described processes may be performed substantially at the same time or performed in an order opposite to the described order. In this disclosure, the term "substantially" includes the meanings of completely, almost completely or to any significant degree under some applications and in accordance with those skilled in the art. Moreover, "formed on" can also mean "formed over." The term "connected" includes an electrical connection.

Figure 1A:
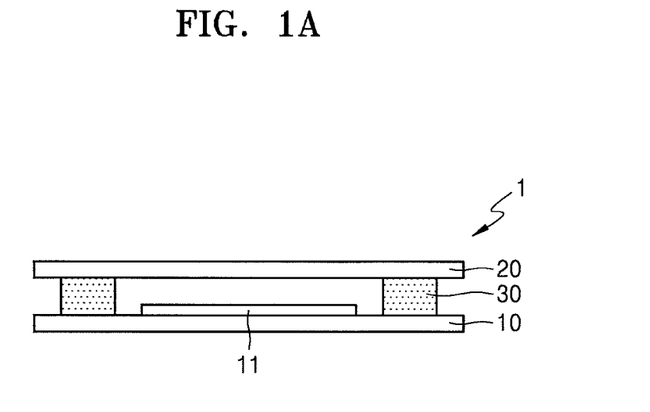
FIGS. 1A and 1B are respectively a cross-sectional view and a plan view illustrating a flat panel display according to an embodiment.
Figure 1B:
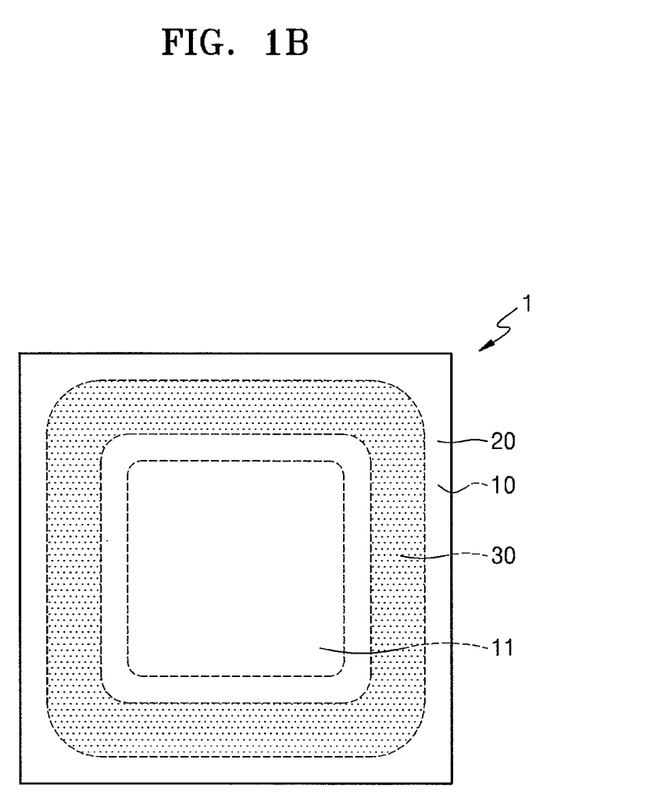

FIGS. 1A and 1B are respectively a cross-sectional view and a plan view illustrating a flat panel display 1 according to an embodiment.

Referring to FIGS. 1A and 1B, the flat panel display 1 includes a first substrate 10, a second substrate 20 that is formed to face the first substrate 10, and a sealing unit 30 that is formed between the first substrate 10 and the second substrate 20 and bonds the first and second substrates 10 and 20.

A display element 11 is provided on the first substrate 10. The first substrate 10 may be a stiff glass or polymer substrate, or a flexible film or metal substrate, or a composite substrate thereof. The display element 11 is a display element that may be form an image, such as an organic light-emitting diode (OLED) element, a liquid crystal display (LCD) element, or an electrophoretic display (EPD) element.

The second substrate 20 may be a transparent member. For example, the second substrate 20 may be a glass substrate. Accordingly, an image that is formed by the display element 11 may be exposed to the outside through the second substrate 20. In some embodiments, the second substrate 20 may further include an on-cell touch screen panel on which a touch screen pattern is formed, in order to function as a touch panel.

A polarization film, a color filter, or a protective window (not shown) may be further provided on the second substrate 20.

The sealing unit 30 is formed between the first substrate 10 and the second substrate 20 to surround the display element 11. The sealing unit 30 forms a closed loop. The sealing unit 30 seals an internal space between the first substrate 10 and the second substrate 20. The sealing unit 30 prevents oxygen or moisture from permeating into the internal space in which the display element 11 is formed. Also, the sealing unit 30 may increase a mechanical strength by stably bonding the first and second substrates 10 and 20. A moisture absorbent or a filing material may be provided in the internal space between the two substrates 10 and 20.

The sealing unit 30 may be an inorganic material. For example, the sealing unit 30 may be a glass frit. The sealing unit 30 may be formed by using a coating method such as dispensing or screen printing. When a laser beam is emitted to the sealing unit 30 and thus the sealing unit 30 is melted (or plastically deformed) and cured, the first substrate 10 and the second substrate 20 may be stably bonded and sealed to each other.

FIGS. 2A through 2E are perspective views for explaining a method of manufacturing the flat panel display 1, according to an embodiment of the present invention.

Figure 2A:
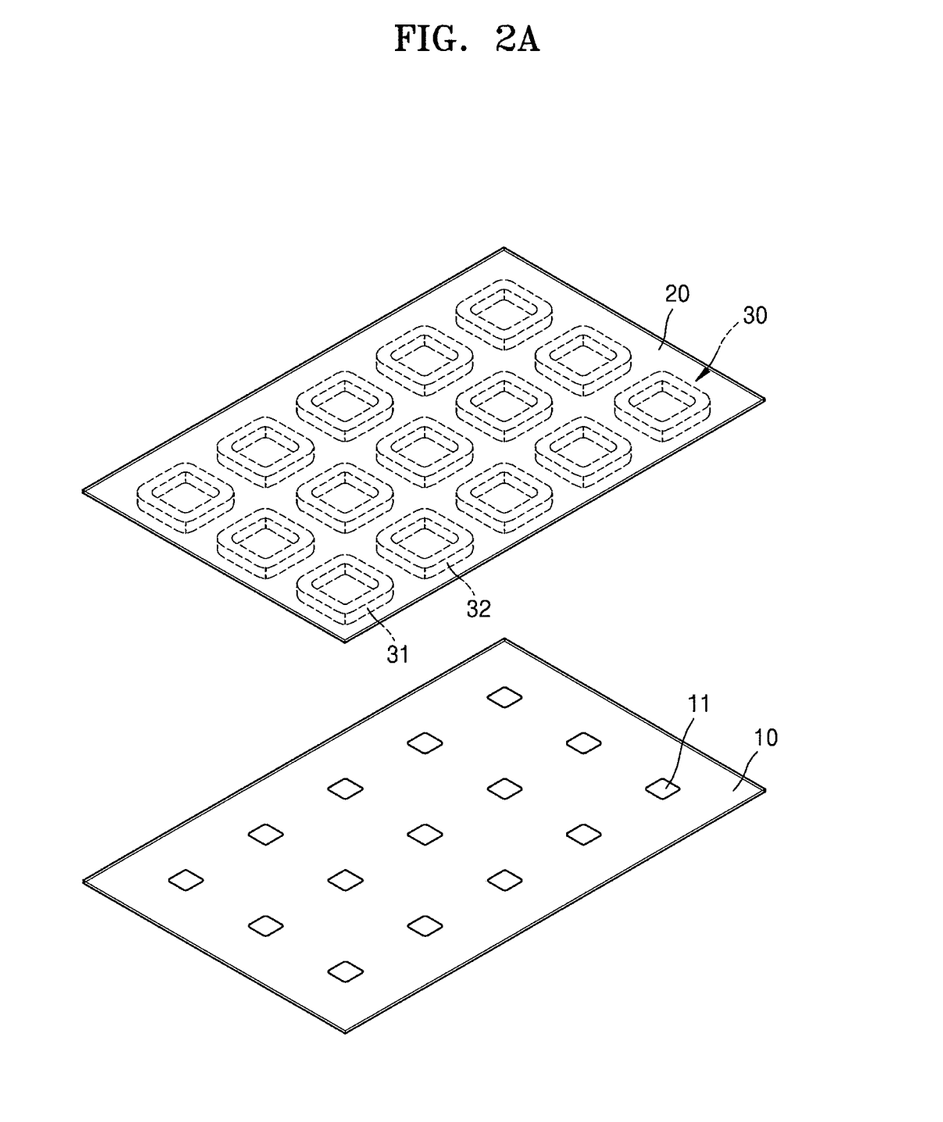
FIGS. 2A through 2E are perspective views for explaining a method of manufacturing the flat panel display according to an embodiment.

Referring to FIG. 2A, a plurality of the display elements 11 are formed on the first substrate 10 to be spaced apart from one another. A plurality of the sealing units 30 that are to respectively surround the plurality of display elements 11 are formed on the second substrate 20. Although the sealing units 30 are formed on the second substrate 20 in FIG. 2A, positions of the sealing units 30 are not limited thereto. For example, the sealing units 30 may be formed on the first substrate 10.

Figure 2B:
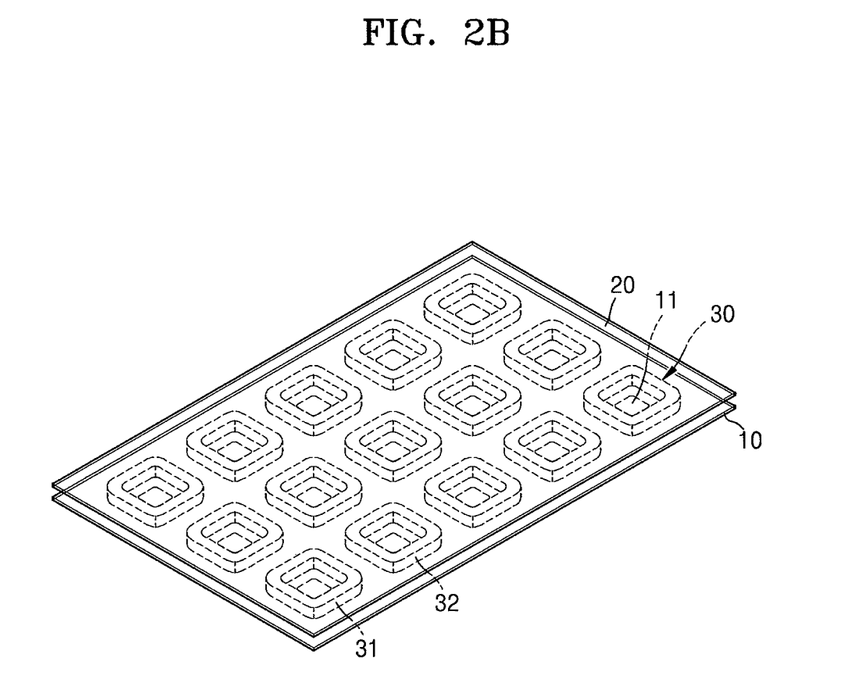

Referring to FIG. 2B, the first substrate 10 and the second substrate 20 are formed to face each other. The display elements 11 that are formed on the first substrate 10 are formed to face the second substrate 20, and the sealing units 30 that are formed on the second substrate 20 are formed to face the first substrate 10. Lower ends of the sealing units 30 that are formed on the second substrate 20 contact the first substrate 10. A predetermined pressure is applied so that the first substrate 10 and the second substrate 20 are closer to each other. As the pressure is applied to the first and second substrates 10 and 20, a space between the two substrates 10 and 20 may be seamlessly and stably sealed by using the sealing units 30 during a subsequent melting and curing process of the sealing units 30.

Figure 2C:
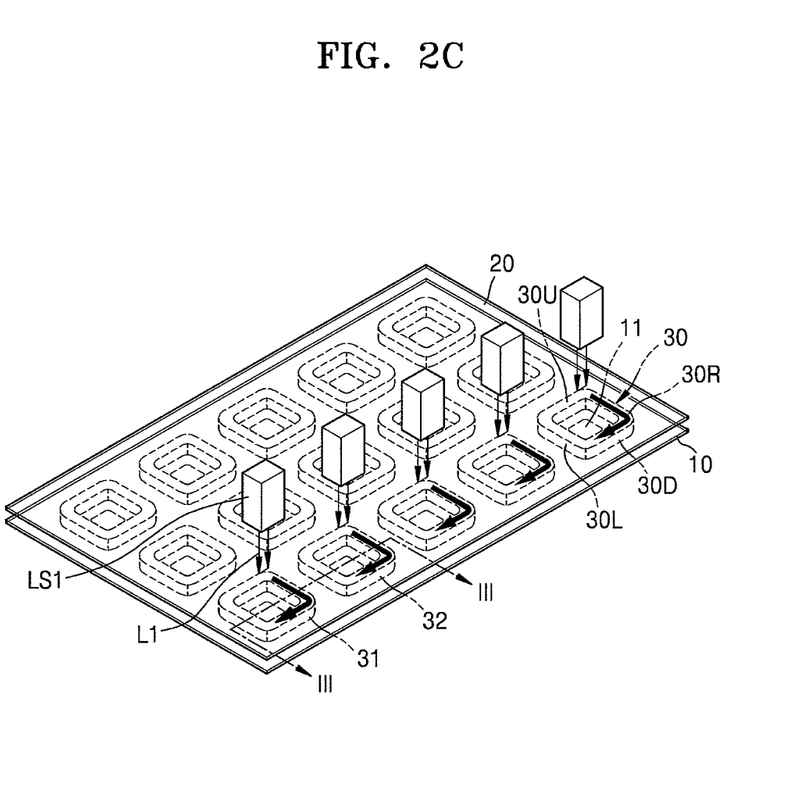

Referring to FIG. 2C, each of a plurality of first laser sources LS1 emits a laser beam L1 along a shape of each of the sealing units 30. Accordingly, the laser beam L1 may be prevented from being emitted to each of the display elements 11.

The first laser source LS1 may emit the laser beam L1 along a shape of the sealing units 30 clockwise or counterclockwise. The following will be explained on the assumption that the laser beam L1 is emitted clockwise.

As the first laser source LS1 emits the laser beam L1 clockwise, the sealing unit 30 is heated clockwise. Accordingly, the sealing unit 30 is melted and cured in an order of a right side 30R, a lower side 30D, a left side 30L, and an upper side 30U.

As described above, since points in time at which the right side 30R and the left side 30L of the sealing unit 30 are cured, are different from each other, a height difference may occur between adjacent sealing units 30, for example, a first sealing unit 31 and a second sealing unit 32. Accordingly, an asymmetric stress may be applied to a portion of the first and/or second substrate 10 or 20 that is formed between the first and second sealing units 31 and 32.

Figure 3A:
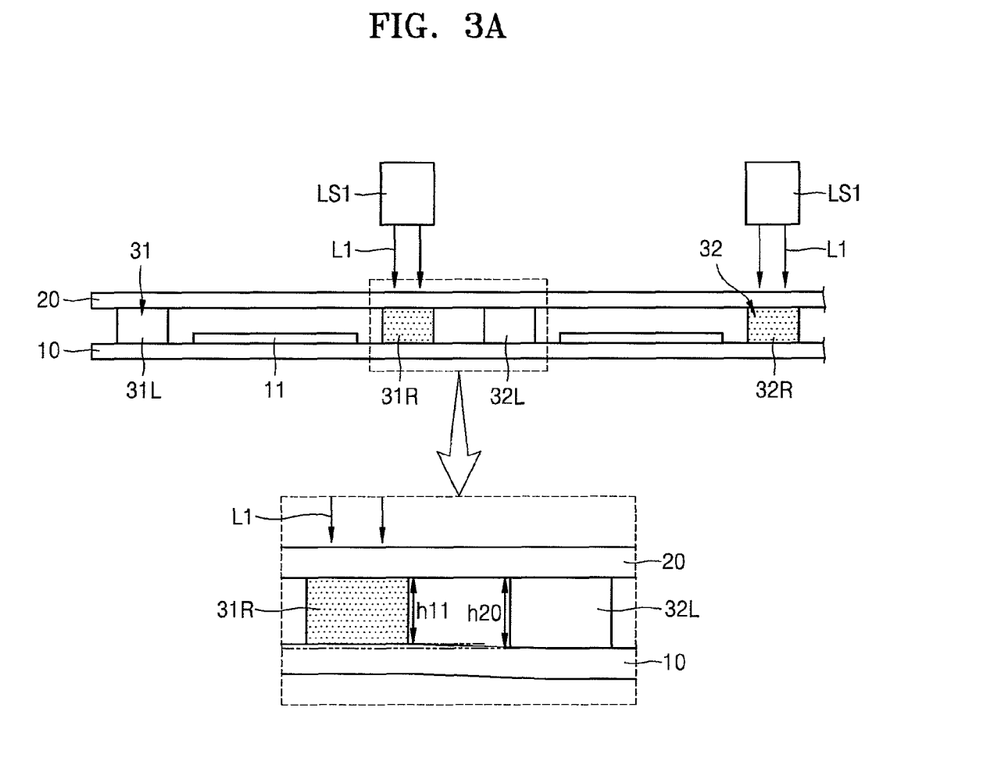
FIGS. 3A and 3B are cross-sectional views taken along line of FIG. 2C, for explaining a change in adjacent sealing units when the adjacent sealing units are heated by a first laser source.
Figure 3B:
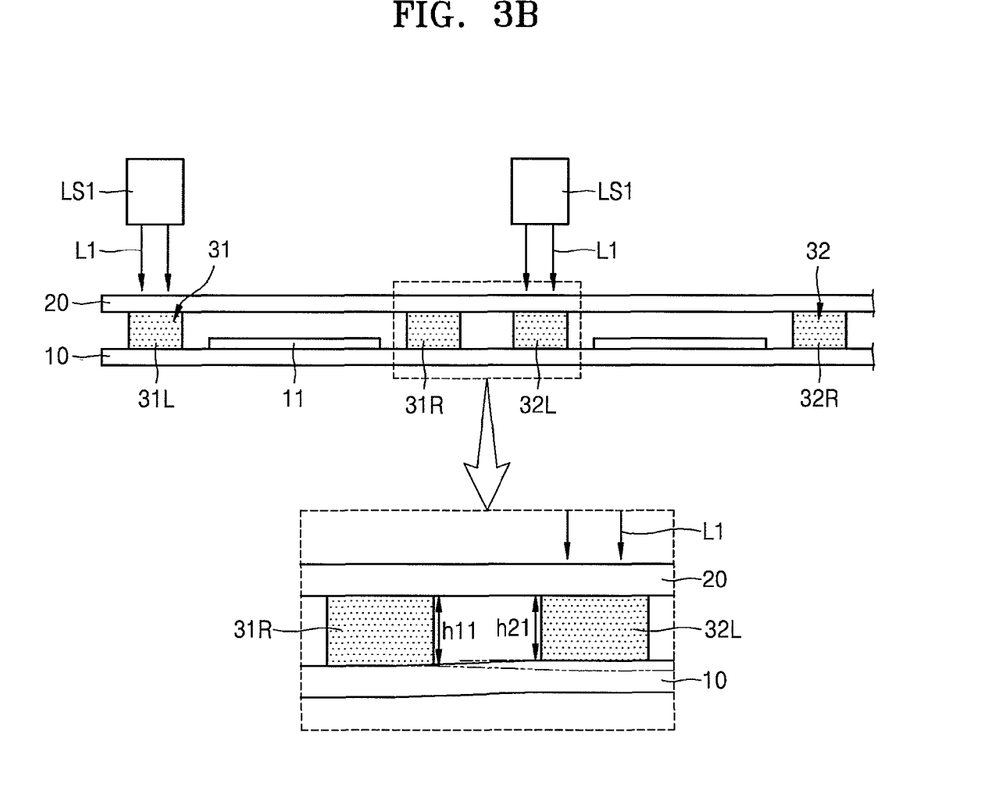

FIGS. 3A and 3B are cross-sectional views taken along line of FIG. 2C, for explaining a change in the first and second sealing units 31 and 32 that are adjacent to each other when the sealing units 30 are heated by the first laser source LS1.

Referring to FIG. 3A, the laser beam L1 of the first laser source LS1 is first emitted to right sides 31R and 32R of the first and second sealing units 31 and 32. In some embodiments, the laser beam L1 is not emitted to left sides 31L and 32L of the first and second sealing units 31 and 32 yet. For example, when the right side 31R of the first sealing unit 31 is heated by the first laser source LS1, the left side 32L of the second sealing unit 32 is not heated yet.

When the right side 31R of the first sealing unit 31 that is heated by the first laser source LS1 is melted, the left side 32L of the second sealing unit 32 that is not heated yet is not melted. A pressure is applied so that the first substrate 10 and the second substrate 20 are closer to each other. Accordingly, a height h11 of the right side 31R of the first sealing unit 31 that is melted is reduced and a height h20 of the left side 32L of the second sealing unit 32 that is not melted yet is maintained. The height h11 of the right side 31R of the first sealing unit 31 can be reduced to be less than the height h20 of the left side 32L of the second sealing unit 32. The term 'height' used herein refers to the distance between a top surface of the first substrate 10 and a top surface of each sealing unit 30.

Referring to FIG. 3B, the first laser source LS1 emits the laser beam L1 through the right sides 31R and 32R and lower sides 31D and 32D of the first and second sealing units 31 and 32 to the left sides 31L and 32L. In this case, the right sides 31R and 32R of the first and second sealing units 31 and 32 are already cured.

The left side 32L of the second sealing unit 32 that is heated by the first laser source LS1 is melted and thus a height h21 is reduced whereas the height h11 of the right side 31R of the first sealing unit 31 to which the laser beam L1 of the first laser source LS1 is not emitted is maintained. The height h21 of the left side 32L of the second sealing unit 32 can be reduced to be less than the height h11 of the right side 31R of the first sealing unit 31.

As points in time at which the laser beam L1 of the first laser source LS1 is emitted to the right sides 31R and 32R and the left sides 31L and 32L of the first and second sealing units 31 and 32 are different from each other, a height difference occurs between facing sides, that is, the right side 31R and the left side 32L of the first and second sealing units 31 and 32 that are adjacent to each other. Accordingly, an asymmetric stress is applied to a portion of the first substrate 10 and/or the second substrate 20 that is formed between the right side 31R of the first sealing unit 31 and the left side 32L of the second sealing unit 32.

Figure 2D:
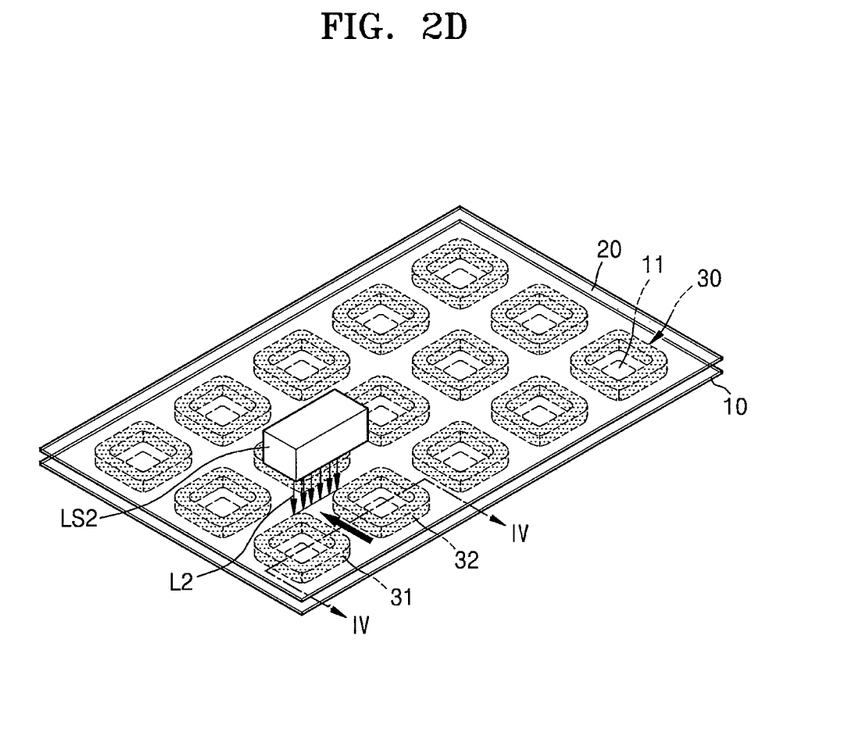

Referring to FIG. 2D, a second laser source LS2 substantially simultaneously emits a laser beam L2 to the facing sides, that is, the right side 31R and the left side 32L, of the first and second sealing units 31 and 32 that are adjacent to each other. For example, the right side 31R of the first sealing unit 31 and the left side 32L of the second sealing unit 32 are substantially simultaneously heated. Accordingly, a height difference between the right side 31R of the first sealing unit 31 and the left side 32L of the second sealing unit 32 may be removed. A stress that is applied to at least one selected from the first substrate 10 and the second substrate 20 due to a height difference between adjacent sealing units 30 may be relieved or reduced.

Figure 4:
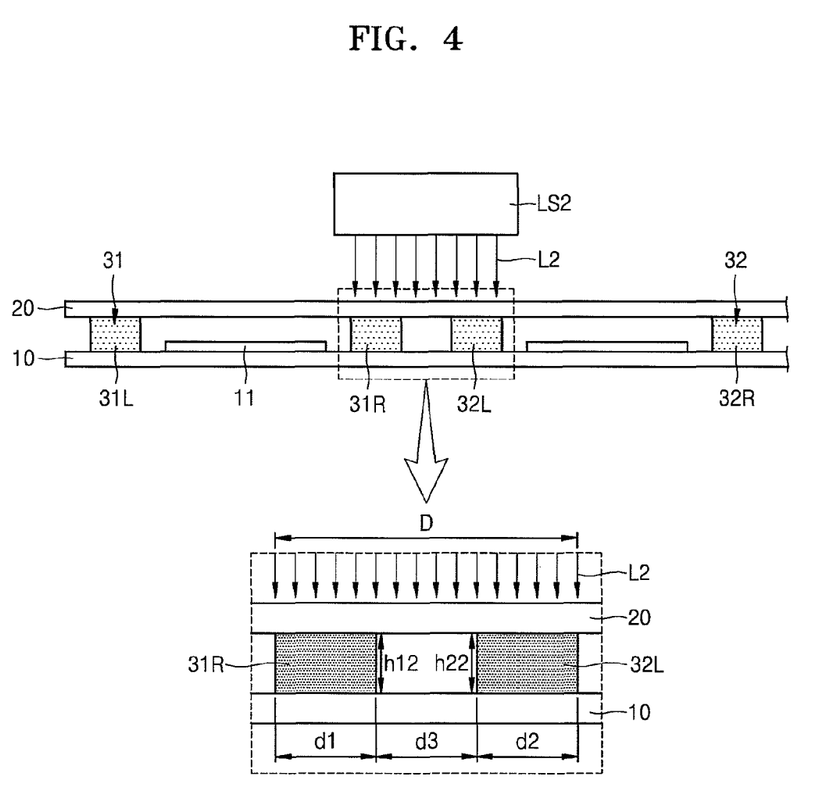
FIG. 4 is a cross-sectional view taken along line IV-IV of FIG. 2D, for explaining a change in adjacent sealing units when the adjacent sealing units are heated by using a second laser source.

FIG. 4 is a cross-sectional view taken along line IV-IV of FIG. 2D, for explaining a change in the first and second sealing units 31 and 32 that are adjacent to each other when the first and second sealing units 31 and 32 are heated by the second laser source LS2.

Referring to FIG. 4, the second laser source LS2 emits the laser beam L2 to the right side 31R of the first sealing unit 31 and to the left side 32L of the second sealing unit 32. Accordingly, the right side 31R of the first sealing unit 31 and the left side 32L of the second sealing unit 32 are substantially simultaneously heated. The right side 31R of the first sealing unit 31 and the left side 32L of the second sealing unit 32 are substantially simultaneously melted, and thus a height h12 of the right side 31R of the first sealing unit 31 and a height h22 of the left side 32L of the second sealing unit 32 are substantially the same. That is, the right side 31R of the first sealing unit 31 and the left side 32L of the second sealing unit 32 have substantially the same height. Accordingly, a height difference between the right side 31R of the first sealing unit 31 and the left side 32L of the second sealing unit 32 of FIG. 3B may be removed. The term 'same height' refers to a case where heights of the first sealing unit 31 and the second sealing unit 32 are identical when measured in units of μm and even when a height difference occurs when measured in units of nm, the height difference is less than about 10% of a height of the first sealing unit 321. For example, when a height of the first sealing unit 31 is about 4.5 μm and a height of the second sealing unit 32 is about 4.4 μm, the height h12 of the first sealing unit 31 and the height h22 of the second sealing unit 32 are considered substantially the same.

The laser beam L2 of the second laser source LS2 that is a single laser source may be emitted to the right side 31R of the first sealing unit 31 and the left side 32L of the second sealing unit 32. To this end, a diameter D of the laser beam L2 that is emitted by the second laser source LS2 may be greater than or substantially equal to the sum of a width d1 of the right side 31R of the first sealing unit 31, a width d2 of the left side 32L of the second sealing unit 32, and a distance d3 between the right side 31R of the first sealing unit 31 and the left side 32L of the second sealing unit 32. As the widths d1 and d2 of the first and second sealing units 31 and 32 decrease or the distance d3 between the first and second sealing units 31 and 32 decreases, that is, as a dead space is slimmer, the diameter D of the laser beam L2 of the second laser source LS2 may decrease.

Figure 5A:
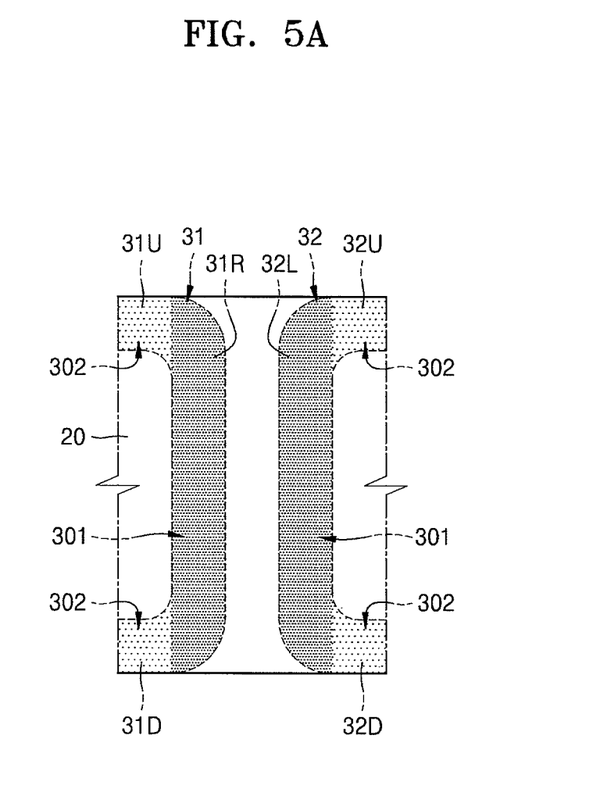
FIG. 5A is a plan view illustrating the adjacent sealing units of FIG. 4, seen from above a second substrate, according to an embodiment.
Figure 5B:
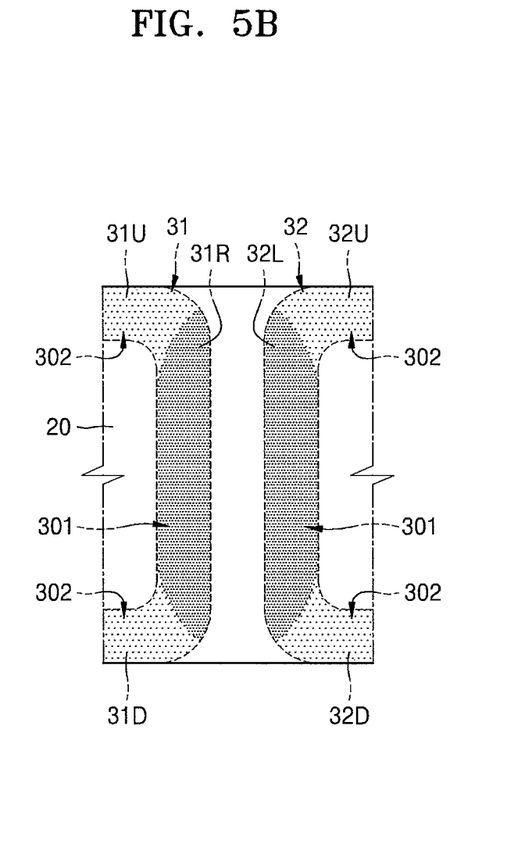
FIG. 5B is a plan view illustrating the adjacent sealing units of FIG. 4, seen from above the second substrate according to another embodiment.

FIG. 5A is a plan view illustrating the first and second sealing units 31 and 32 that are adjacent to each other of FIG. 4, seen from above the second substrate 20, according to an embodiment. FIG. 5B is a plan view illustrating the first and second sealing units 31 and 32 that are adjacent to each other of FIG. 4, seen from above the second substrate 20, according to another embodiment. FIGS. 5A and 5B illustrate a state where the laser beam L2 of the second laser source LS2 is emitted from the bottom to the top of the right side 31R of the first sealing unit 31 and the left side 32L of the second sealing unit 32.

Referring to FIG. 5A, each of the first and second sealing units 31 and 32 includes a first portion 301 to which the laser beam L2 of the second laser source LS2 is emitted and a second portion 302 to which the laser beam L2 of the second laser source LS2 is not emitted. The right side 31R of the first sealing unit 31 is included in the first portion 301 of the first sealing unit 31, and the left side 32L of the second sealing unit 32 is included in the first portion 301 of the second sealing unit 32. An upper side 31U and the lower side 31D of the first sealing unit 31 are included in the second portion 302 of the first sealing unit 31, and an upper side 32U and the lower side 32D of the second sealing unit 32 are included in the second portion 302 of the second sealing unit 32.

Since the second portion 302 allows the laser beam L2 of the second laser source LS2 to be emitted thereto, unlike the first portion 301, the second portion 302 may have characteristics different from those of the first portion 301.

For example, since the second portion 302 is heated one more time than the first portion 301, the second portion 302 may have a color that is different from that of the first portion 301. When colors are different from each other, it means that at least one of hues, brightnesses, and saturations are different. For example, a brightness of the second portion 302 may be lower than a brightness of the first portion 301.

Also, since the second portion 302 is heated one more time than the first portion 301, a height of the second portion 302 may be less than a height of the first portion 301.

A shape of the first portion 301 may vary according to a method in which the laser beam L2 of the second laser source LS2 is emitted. For example, when the laser beam L2 is continuously emitted from the bottom to the top of the right side 31R of the first sealing unit 31 and the left side 32L of the second sealing unit 32 without cutting off power supply to the second laser source LS2, a boundary between the first portion 301 and the second portion 302 may be linear as shown in FIG. 5A. However, when power begins to be supplied to the second laser source LS2 at the bottom of the right side 31R of the first sealing unit 31 and the left side 32L of the second sealing unit 32 and power supply to the second laser LS2 is cut off at the top of the right side 31R of the first sealing unit 31 and the left side 32L of the second sealing unit 32, a boundary between the first portion 301 and the second portion 302 may be curved as shown in FIG. 5B.

Figure 2E:
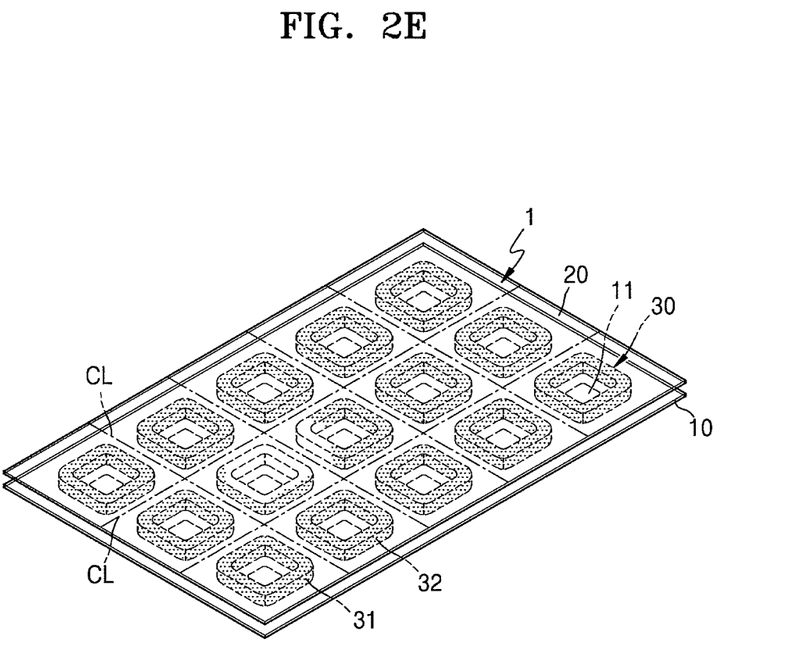

Referring to FIG. 2E, the first substrate 10 and the second substrate 20 are cut along a cutting line CL. Accordingly, a plurality of the flat panel displays 1 may be manufactured.

As such, since a stress that is applied to the first and second substrates 10 and 20 is reduced, a phenomenon where the first substrate 10 and the second substrate 20 crack, not along the cutting line CL, during a cutting process may be prevented.

If the emitting of the laser beam L2 by the second laser source LS2 of FIG. 2D is omitted, an end portion of the first substrate 10 or the second substrate 20 may crack during a cutting process due to an asymmetric stress that is applied to the first and second substrates 10 and 20.

If the laser beam L2 of the second laser source LS2 is emitted to only the right side 31R of the first sealing unit 31 except the left side 32L of the second sealing unit 32, it is difficult to make the same heights of the right side 31R of the first sealing unit 31 and the left side 32L of the second sealing unit 32. Accordingly, end portions of the first and second substrates 10 and 20 may still crack during a cutting process due to an asymmetric stress that is applied to the first and second substrates 10 and 20. In this case, it is difficult to reduce a cutting margin between the cutting line CL and the sealing unit 30 to 250 µm or less.

However, in the present embodiment, since the right side 31R of the first sealing unit 31 and the left side 32L of the second sealing unit 32 are substantially simultaneously heated by the second laser source LS2, a height difference between the right side 31R of the first sealing unit 31 and the left side 32L of the second sealing unit 32 may be easily compensated for. Accordingly, a cutting margin may be reduced to about 250 µm or less. In detail, a cutting margin may be reduced to about 150 µm or less.

The above embodiment has focused on the right side 31R of the first sealing unit 31 and the left side 32L of the second sealing unit 32 that are adjacent to each other. However, this is exemplary and the present embodiment is not limited thereto. For example, facing sides of adjacent sealing units 30 may be an upper side of one sealing unit 30 and a lower side of another sealing unit 30 that is adjacent to the one sealing unit 30.

A method of manufacturing a flat panel display and a method of sealing the flat panel display according to the one or more embodiments can prevent first and second substrates from cracking during a cutting process by substantially simultaneously heating facing sides of adjacent sealing units by using a second laser source.

While the inventive technology has been described with reference to the figures, it will be understood by those of ordinary skill in the art that various changes in form and details may be made therein without departing from the spirit and scope of the following claims.

What is claimed is:

1. A method of manufacturing a flat panel display, the method comprising:
    forming a plurality of display elements over a first substrate;
    forming over the first substrate or a second substrate a plurality of sealing units respectively surrounding the display elements;
    arranging the first and second substrates to face each other; and
    emitting a laser beam to the sealing units so as to bond the first and second substrates,
    wherein the emitting comprises:
        (a) emitting a first laser beam, from a first laser source, clockwise or counterclockwise along perimeters of the sealing units; and
        (b) substantially simultaneously emitting a second laser beam, from a second laser source different from the first laser source, to facing sides of adjacent ones of the sealing units onto which the first laser beam has been emitted.

2. The method of claim 1, wherein during the emitting (a), points in time at which the first laser beams are emitted to the facing sides of the adjacent sealing units are different from each other.

3. The method of claim 2, wherein the emitting (a) is performed such that the heights of the facing sides of the adjacent sealing units are different from each other.

4. The method of claim 3, wherein the emitting (b) is performed such that the heights of the facing sides of the adjacent sealing units are substantially identical to each other.

5. The method of claim 4, wherein each of the sealing units comprises a first portion to which the second laser beam is emitted and a second portion to which the second laser beam is not emitted, and wherein the first and second portions have different colors.

6. The method of claim 1, wherein the second laser source comprises a single laser source.

7. The method of claim 1, further comprising cutting the first substrate and the second substrate along a cutting line according to unit display elements.

8. A method of manufacturing a flat panel display, the method comprising:
    providing a plurality of sealing units to respectively surround a plurality of display elements formed between first and second substrates facing each other;
    first emitting a first laser beam, from a first laser source, clockwise or counterclockwise along perimeters of the sealing units; and
    second emitting a second laser beam substantially simultaneously, from a second laser source different from the first laser source, to facing sides of adjacent ones of the sealing units onto which the first laser beam has been emitted.

9. The method of claim 8, wherein during the first emitting, points in time at which the first laser beams are emitted to the facing sides of the adjacent sealing units are different from each other.

10. The method of claim 9, wherein the first emitting is performed such that the heights of the facing sides of the adjacent sealing units are different from each other.

11. The method of claim 10, wherein the second emitting is performed such that the heights of the facing sides of the adjacent sealing units are substantially identical to each other.

12. The method of claim 11, wherein each of the sealing units comprises a first portion to which the second laser beam is emitted and a second portion to which the second laser beam is not emitted, and wherein the first and second portions have different colors.

13. The method of claim 8, wherein the second laser source comprises a single laser source.

14. A method of manufacturing a flat panel display, the method comprising:
    forming a plurality of display elements between first and second substrates;
    forming a plurality of sealing units between the first and second substrates to respectively surround the display elements;
    sequentially emitting a first laser beam, from a first laser source, along perimeters of the sealing units; and
    substantially simultaneously emitting a second laser beam, from a second laser source different from the first laser source, to facing sides of adjacent ones of the sealing units onto which the first laser beam has been emitted.

16. The method of claim 14, wherein the perimeters comprise the facing sides of the adjacent sealing units, and wherein the sequentially emitting is performed such that the heights of the facing sides of the adjacent sealing units are different from each other.

16. The method of claim 14, wherein the substantially simultaneously emitting is performed such that the heights of the facing sides of the adjacent sealing units are substantially identical to each other.

17. The method of claim 16, wherein each of the sealing units comprises a first portion to which the second laser beam is emitted and a second portion to which the second laser beam is not emitted, and wherein the first and second portions have different colors.

18. The method of claim 14, wherein the second laser source comprises a single laser source.

19. The method of claim 14, wherein the sealing units are arranged in a column and row configuration.

20. The method of claim 14, wherein the sealing units are spaced apart from each other.

* * * * *